US009711386B2

(12) United States Patent
Cox et al.

(10) Patent No.: US 9,711,386 B2
(45) Date of Patent: Jul. 18, 2017

(54) ELECTROSTATIC CHUCK FOR HIGH TEMPERATURE PROCESS APPLICATIONS

(71) Applicant: Applied Materials, Inc., Santa Clara, CA (US)

(72) Inventors: Michael S. Cox, Gilroy, CA (US); Zheng Yuan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 308 days.

(21) Appl. No.: 14/336,717

(22) Filed: Jul. 21, 2014

(65) Prior Publication Data

US 2015/0022936 A1 Jan. 22, 2015

Related U.S. Application Data

(60) Provisional application No. 61/856,911, filed on Jul. 22, 2013.

(51) Int. Cl.
| | |
|---|---|
| *H01L 21/683* | (2006.01) |
| *H05K 3/10* | (2006.01) |
| *H05K 3/28* | (2006.01) |
| *H05K 1/03* | (2006.01) |
| *H05K 1/16* | (2006.01) |

(52) U.S. Cl.
CPC ......... *H01L 21/6833* (2013.01); *H05K 3/285* (2013.01); *H05K 1/0306* (2013.01); *H05K 1/162* (2013.01); *H05K 2201/017* (2013.01); *H05K 2201/068* (2013.01); *H05K 2201/09236* (2013.01); *H05K 2201/09254* (2013.01); *H05K 2203/0195* (2013.01); *H05K 2203/1338* (2013.01); *Y10T 29/49155* (2015.01)

(58) Field of Classification Search
CPC .. H01L 21/6833; H05K 1/0306; H05K 1/162; H05K 3/10; H05K 3/285; H05K 2201/017; H05K 2201/068; H05K 2201/09236; H05K 2201/09254; H05K 2203/0195; H05K 2203/1338; Y10T 29/49155
USPC ........................................................ 361/234
See application file for complete search history.

(56) References Cited

U.S. PATENT DOCUMENTS

| | | | |
|---|---|---|---|
| 4,751,609 | A | 6/1988 | Kasahara |
| 5,789,843 | A | 8/1998 | Higuchi et al. |
| | | (Continued) | |

FOREIGN PATENT DOCUMENTS

| | | | |
|---|---|---|---|
| JP | 04237148 A | * | 8/1992 |
| JP | H04237148 A | | 8/1992 |
| | (Continued) | | |

OTHER PUBLICATIONS

Machine translation of JP2008028297, Miyata, Feb. 7, 2008.*

(Continued)

*Primary Examiner* — Thienvu Tran
*Assistant Examiner* — Kevin J Comber
(74) *Attorney, Agent, or Firm* — Patterson + Sheridan, LLP (57) ABSTRACT

Embodiments of the present invention provide a substrate support assembly including an electrostatic chuck with enhanced heat resistance. In one embodiment, an electrostatic chuck includes a support base, an electrode assembly having interleaved electrode fingers formed therein, and an encapsulating member disposed on the electrode assembly, wherein the encapsulating member is fabricated from one of a ceramic material or glass.

20 Claims, 4 Drawing Sheets

(56) References Cited

U.S. PATENT DOCUMENTS

| | | |
|---|---|---|
| 6,055,150 A | 4/2000 | Clinton et al. |
| 6,120,661 A | 9/2000 | Hirano et al. |
| 6,678,143 B2 | 1/2004 | Masuda et al. |
| 6,768,627 B1 | 7/2004 | Kitabayashi et al. |
| 6,781,812 B2 | 8/2004 | Fuwa et al. |
| 7,804,675 B2 | 9/2010 | Poh |
| 7,881,036 B2 | 2/2011 | Fujisawa et al. |
| 7,916,447 B2 | 3/2011 | Kobayashi et al. |
| 8,125,756 B2 | 2/2012 | Poh |
| 8,238,072 B2 | 8/2012 | Fujisawa et al. |
| 8,320,099 B2 | 11/2012 | Hirahara et al. |
| 8,325,457 B2 | 12/2012 | Park et al. |
| 8,335,070 B2 | 12/2012 | Poh |
| 8,503,156 B2 | 8/2013 | Ray et al. |
| 8,730,644 B2 | 5/2014 | Fujisawa et al. |
| 9,287,806 B2 | 3/2016 | Park |
| 2001/0043452 A1* | 11/2001 | Divakar ............ H01L 21/6833 361/234 |
| 2008/0062609 A1 | 3/2008 | Himori et al. |
| 2009/0284894 A1 | 11/2009 | Cooke |
| 2011/0102965 A1* | 5/2011 | Fujisawa ............ H01L 21/6833 361/234 |
| 2012/0033340 A1 | 2/2012 | Roy et al. |
| 2012/0227886 A1 | 9/2012 | Hsiao et al. |
| 2013/0001899 A1 | 1/2013 | Hwang et al. |
| 2013/0088809 A1 | 4/2013 | Parkhe et al. |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| JP | 2002-357838 A | 12/2002 |
| JP | 2003-179128 A | 6/2003 |
| JP | 2003-243493 A | 8/2003 |
| JP | 2004260088 A | 9/2004 |
| JP | 2008028297 A | 2/2008 |
| JP | 2008244147 A | 10/2008 |
| JP | 04237148 B2 | 3/2009 |

OTHER PUBLICATIONS

Machine translation of JP2004260088, Ishida et al. Sep. 16, 2004.*
Machine translation of JP04237148, Koguchi, Aug. 25, 1992.*
PCT international search report and written opinion of PCT/US2014/047291, dated Nov. 5, 2014.

* cited by examiner

ELECTROSTATIC CHUCK FOR HIGH TEMPERATURE PROCESS APPLICATIONS

CROSS-REFERENCE TO RELATED APPLICATIONS

This application claims benefit of U.S. Provisional Application Ser. No. 61/856,911 filed Jul. 22, 2013, which is incorporated by reference in its entirety.

BACKGROUND OF THE INVENTION

Field of the Invention

Embodiments of the invention generally relate to a substrate support assembly, more specifically, for an electrostatic chuck having an encapsulating member formed thereon with enhanced heat resistance suitable for use in a plasma processing chamber.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

During manufacture of the integrated circuits, display devices or other semiconductor related products, a number of different chemical and physical processes are involved whereby minute transistor devices are created on a substrate. Layers of materials which make up the transistor devices are created by chemical vapor deposition, physical vapor deposition, epitaxial growth, and the like. Some of the layers of material are patterned using photoresist masks and wet or dry etching techniques. The substrate utilized to form transistor devices may be silicon, quartz, sapphire, gallium arsenide, indium phosphide, glass, or other appropriate material. In some applications, flexible substrates, polymer substrates or plastic substrates may also be utilized.

A typical plasma processing chamber includes a chamber body defining a process zone, a gas distribution assembly adapted to supply a gas from a gas supply into the process zone, a gas energizer, e.g., a plasma generator, utilized to energize the process gas used to process a substrate positioned on a substrate support assembly, and a gas exhaust. The substrate support assembly may include an electrostatic chuck that holds the substrate to the substrate support assembly during processing. Conventionally, for a thin substrate process, such as a substrate having a thickness less than 200 μm, an electrostatic chuck configured for low temperature processing is often used. The low temperature processing electrostatic chuck includes a laminated structure having a polymer-type underlayer, an electrode disposed on the polymer-type underlayer and a polymer-type encapsulating overlayer disposed on the electrode. This particular type of electrostatic chuck with polymer-type underlayer and polymer-type encapsulating overlayer is believed to be advantageous for processing thinned substrate for LED/OLED manufacturing, semiconductor manufactured on thin sapphire, touch screen/touch panel and other display device applications.

In high temperature plasma processing applications, the temperature within the chamber may be greater than 300 degrees Celsius. Conventional electrostatic chucks with polymer-type encapsulating layers may not be suitable for use in such high temperature processes as the high temperature of corrosive species generated during plasma may melt or erode the polymer-type layers, resulting in inconsistent or undesirable electrical properties of the chuck which adversely affects the chuck's ability to hold substrates. Typically, the electrostatic chuck with polymer-type encapsulating layers can only sustain process temperature less than 250 degrees Celsius without failure. Thus, it would be desirable to have an electrostatic chuck having enhanced heat resistance as well as the capability to chuck thin substrates during processing.

Therefore, there is a need for an improved electrostatic chuck that provides enhanced heat resistance during processing.

SUMMARY OF THE INVENTION

Embodiments of the present invention provide a substrate support assembly having an electrostatic chuck that enhances heat resistance. The electrostatic chuck may provide an encapsulating layer with high heat resistance on the electrostatic chuck, thereby improving the service life of the substrate support assembly while reducing maintenance and manufacturing cost.

In one embodiment, an electrostatic chuck includes a support base, an electrode assembly having interleaved electrode fingers formed therein, and an encapsulating member disposed on the electrode assembly, wherein the encapsulating member is fabricated from one of a ceramic material or glass.

In another embodiment, a method for fabricating an electrostatic chuck includes disposing an electrode assembly on a support base, wherein the electrode assembly includes a plurality of intervening electrode fingers, and forming an encapsulating member on the electrode assembly, wherein the encapsulating member is fabricated from a glass or ceramic material.

In yet another embodiment, an electrostatic chuck includes a support base fabricated from glass or a ceramic material, an electrode assembly disposed on the support base, wherein the electrode assembly has at least two independently bias able electrodes having a plurality of interleaving electrode fingers formed therein, and an encapsulating member disposed on the electrode assembly, the encapsulating member fabricated from a glass or ceramic material having a coefficient of thermal expansion substantially matching the coefficient of thermal expansion of a material forming the electrode assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Embodiments of the present invention provide a substrate support assembly including an electrostatic chuck having an encapsulating layer having a distributed electrode disposed therein, the encapsulating layer having enhanced heat resistance and plasma resistance, compared to conventional polymer-type electrostatic chucks. In one embodiment, the encapsulating layer may be an insulating layer made from a ceramic material or a glass material. In one embodiment, the insulating layer provides enhanced heat resistance surface on the substrate support assembly, thereby improving the service life of the substrate support assembly and increasing the process window, while reducing maintenance and manufacturing cost. Although the description provided herein describes an electrostatic chuck suitable for vacuum processing a semiconductor substrate, it is contemplated that the electrostatic chuck may be configured to use to electrostatically chuck other workpieces, such as glass panels, plastic panels, LED substrates, or other electrostatically retainable substrates or workpieces. Furthermore, the electrostatic chuck may be a stationary workpieces securely positioned in a processing chamber, or moveable carrier configured to transfer substrates, such as thin substrates, in a processing chamber.

Figure 1:
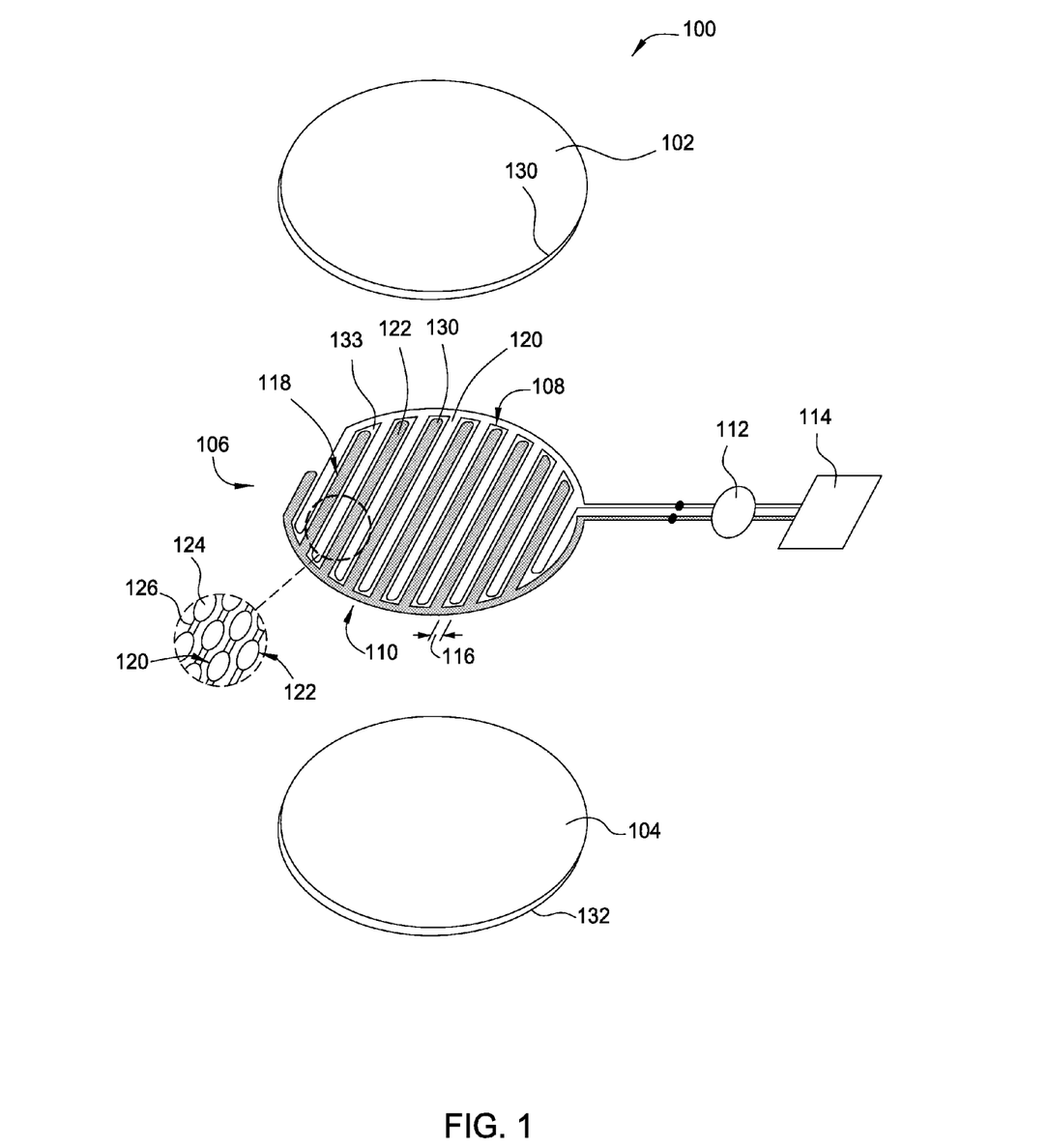
FIG. 1 depicts an exploded view of one embodiment of an electrostatic chuck according the present invention.

FIG. 1 depicts an exploded view of one embodiment of an electrostatic chuck 100. The electrostatic chuck 100 may be used in any suitable plasma process, including physical vapor deposition (PVD) process, chemical vapor deposition (CVD) process, etching process, or any suitable plasma or vacuum process. The electrostatic chuck 100 may also be adapted for use in non-plasma and non-vacuum environments, particularly for high temperature applications. Although one embodiment of an electrostatic chuck 100 is disposed herein, it is contemplated that the electrostatic chuck may have other configurations.

The electrostatic chuck 100 includes a rigid support base 104, an electrode assembly 106 disposed on the rigid support base 104, and an encapsulating member 102 disposed on the electrode assembly 106. The rigid support base 104 may have any suitable shapes selected for handling a specific workpiece, and in the illustrative example depicted in FIG. 1, the rigid support base 104 has a circular-like shape having a periphery 132 that substantially matches the shape and size of electrode assembly 106 and the rigid support base 104 sequentially formed thereon to allow a substrate with similar shape and size to be disposed thereon. It is noted that the rigid support base 104 may be in any shapes or configurations as needed. In one embodiment, the rigid support base 104 may be fabricated from an insulating material, such as a dielectric material or a ceramic material. Suitable examples of the ceramic materials or dielectric materials include silicon oxide, such as quartz or glass, sapphire, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. Optionally, the rigid support base 104 may be a metallic body having a dielectric layer disposed on the surface facing the electrostatic assembly 106.

The electrode assembly 106 disposed on the rigid support base 104 includes at least two sets of distributed electrodes 108, 110. Each electrode 108, 110 may be charged with different polarities as needed when a voltage power is applied thereto, thus generating an electrostatic force. The electrodes 108, 110 are configured to distribute the electrostatic force along a distance at least two times with width of the electrostatic chuck 100. Each electrode 108, 110 may each have a plurality of electrode fingers 120, 122 intervening with each other. It is believed that electrode interleaved fingers 120, 122 provides local electrostatic attraction distributed across a large area of the electrostatic chuck 100 which in the aggregation provides a high chucking force while using less chucking power. The electrode fingers 120, 122 may be formed to have different lengths and geometry. In one example, one or both of the electrode fingers 120, 124 may be formed from interconnected electrode islands 124. Interconnections 126 between electrode islands 124 may be in the plane of the electrodes 108, 110 as shown in FIG. 1, or out of plane, such as in the form of jumpers and/or vias. In one embodiment, the electrode finger 120, 122 has a width 116 of between about 0.25 mm and about 10 mm.

Between each of the electrode fingers 120 of the first electrode 108, spaces 133 are defined to receive electrode fingers 122 of the second electrode 110. The spaces 133 may be an air gap, filled with a dielectric spacer material, or filled with at least one of the rigid support base 104 or encapsulating member 102.

A power source 114 is coupled to the first and the second electrode 108, 110 through a power switch 112. The power source 114 is configured to provide a voltage power to the first and the second electrode 108, 110 to generate charges with different polarities, either positive or negative charges. The positive or negative charges generated from the first and the second electrode 108, 110 provide an electrostatic force to attract a substrate disposed in the electrostatic chuck 100 in a secured position. In one embodiment, the power source 114 may be configured to provide a DC or AC power to the first and the second electrodes 108, 110.

The encapsulating member 102 is disposed on the rigid support base 104 sandwiching the electrode assembly 106, to form the electrostatic chuck 100 as a unitary structure. The encapsulating member 102 is positioned on the electrode assembly 106 to provide an insulating surface on which the substrate is chucked. The encapsulating member 102 may be fabricated by a material having thermal properties, e.g., coefficient of thermal expansion, substantially matching that of the underlying electrode assembly 106, and in some embodiments, also the rigid support base 104.

After the encapsulating member 102, the electrode assembly 106 and the rigid support base 104 are stacked in a predetermined order, a bonding process, such as an annealing process, is performed to fuse the encapsulating member 102, the electrode assembly 106 and the rigid support base 104 together, forming a laminated structure of the electrostatic chuck 100 as an integral part. As the encapsulating member 102, the electrode assembly 106 and the rigid support base 104 may be required to operate in a high temperature environment, e.g., greater than 300 degrees Celsius, the materials utilized to fabricate these three components may be selected from heat resistance materials, such as ceramic materials or glass materials, that can sustain high thermal treatment during the heat process. In one embodiment, the encapsulating member 102 and the rigid support base 104 may be fabricated from a ceramic material, a glass material, or a composite of ceramic and metal material, providing good strength and durability as well as good heat transfer properties. The materials selected to fabricate the encapsulating member 102 and the rigid support base 104 may have a coefficient of thermal expansion that is substantially matched to the intermediate electrode assembly 106 to reduce thermal expansion mismatch, which may cause stress or failure under high thermal loads. In one embodiment, the coefficient of thermal expansion of the encapsulating member 102 is between about 2 µm/(m*K) and about 8 µm/(m*K). Ceramic materials suitable for fabricating the encapsulating member 102 and the rigid support base 104 may include, but not limited to, glass, sapphire, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 102 and the rigid support base 104 may be fabricated from a composite material includes a different composition of a ceramic and metal, such as metal having dispersed ceramic particles.

In one embodiment, the electrode assembly 106 may be fabricated from a metallic material, such as molybdenum, having a coefficient of thermal expansion similar to the adjacent encapsulating member 102 and the rigid support base 104. In one embodiment, the coefficient of thermal expansion of the electrode assembly 106 is between about 4 µm/(m*K) and about 6 µm/(m*K), and is generally within 20 percent of the coefficient of thermal expansion of the encapsulating member 102.

During operation, a negative charge may be applied to the first electrode 108 and a positive charge may be applied to the second electrode 110, or vise versa, to generate an electrostatic force, when a power is supplied to the power source 114. During chucking, the electrostatic force generated from the electrodes 108, 110 chucks and holds the substrate disposed thereon in a secured position. As the power supplied from the power source 114 is turned off, the charges present in the interface 118 between the electrodes 108, 110 may be maintained over a long period of time. To release the substrate held on the electrostatic chuck 100, a short pulse of power in the opposite polarity is provided to the electrodes 108, 110 to remove the charge present in the interface 118.

Figure 2:
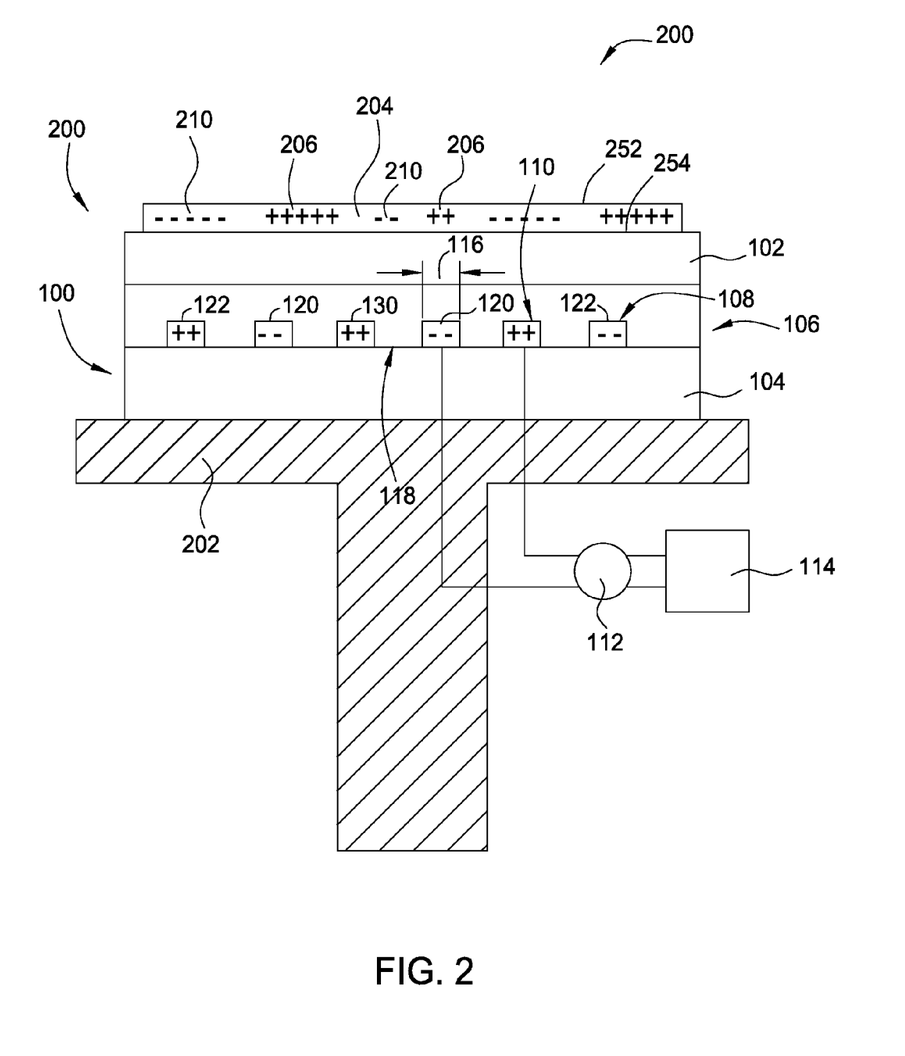
FIG. 2 depicts a second view of a substrate support assembly with the electrostatic chuck of FIG. 1 utilized therein according the present invention.

FIG. 2 describes a sectional view of one embodiment of a substrate support assembly 200 having the electrostatic chuck 100 implemented on a pedestal 202. The substrate support assembly 200 can then be further placed in a processing chamber, such as a plasma processing vacuum chamber, to hold a substrate 204 disposed thereon during processing. It is noted that although the substrate support assembly 200 described herein is used for vacuum plasma processing, it is noted that the substrate support assembly 200 in any suitable processing tools, including those processing equipments working under atmosphere or any conditions.

As depicted in the cross sectional view of FIG. 2, the electrode assembly 106 may include the first electrode 108 and the second electrode 106 with intervening electrode fingers 120, 122. In the example depicted in FIG. 2, a negative charge is applied to the first electrode 108 and a positive charge is applied to the second electrode 110. The negative and positive charges generated from the electrode assembly 106 respectively induce the substrate 204 to generate charges with opposite polarities, i.e., positive charges and negative charges, thereby generating an electrostatic force to chuck the substrate 204 on the substrate support assembly 200. For example, negative charges present on the electrode fingers 120 of the first electrode 108 may induce the substrate 204 to locally generate positive charges 206, so as to create electrostatic force to securely position to the substrate 204 on the substrate support assembly 200. Similarly, positive charges present on the electrode fingers 122 of the second electrode 110 may induce the substrate 204 to locally generate negative charges 210. By utilizing the intervening finger electrodes 120, 122 of the first and the second electrode 108, 110, an enhanced and localized electrostatic field may be created which is distributed across a greater area of the electrostatic chuck 100 due to the long length of the interface 118 defined between the fingers 120, 122, generating an electrostatic attraction to the substrate, helping to retain the substrate 204 on the substrate support assembly 200 using less chucking power compared to conventional electrostatic chucks. Additionally, the ability to maintain the chucking force to the substrate 204 enables the substrate 204 to be retained on the substrate support assembly 200 without power supplied to the electrode assembly 106, thereby reducing likelihood of charging defects created on thin substrates 204 and substrate breakage and damage.

Figure 3:
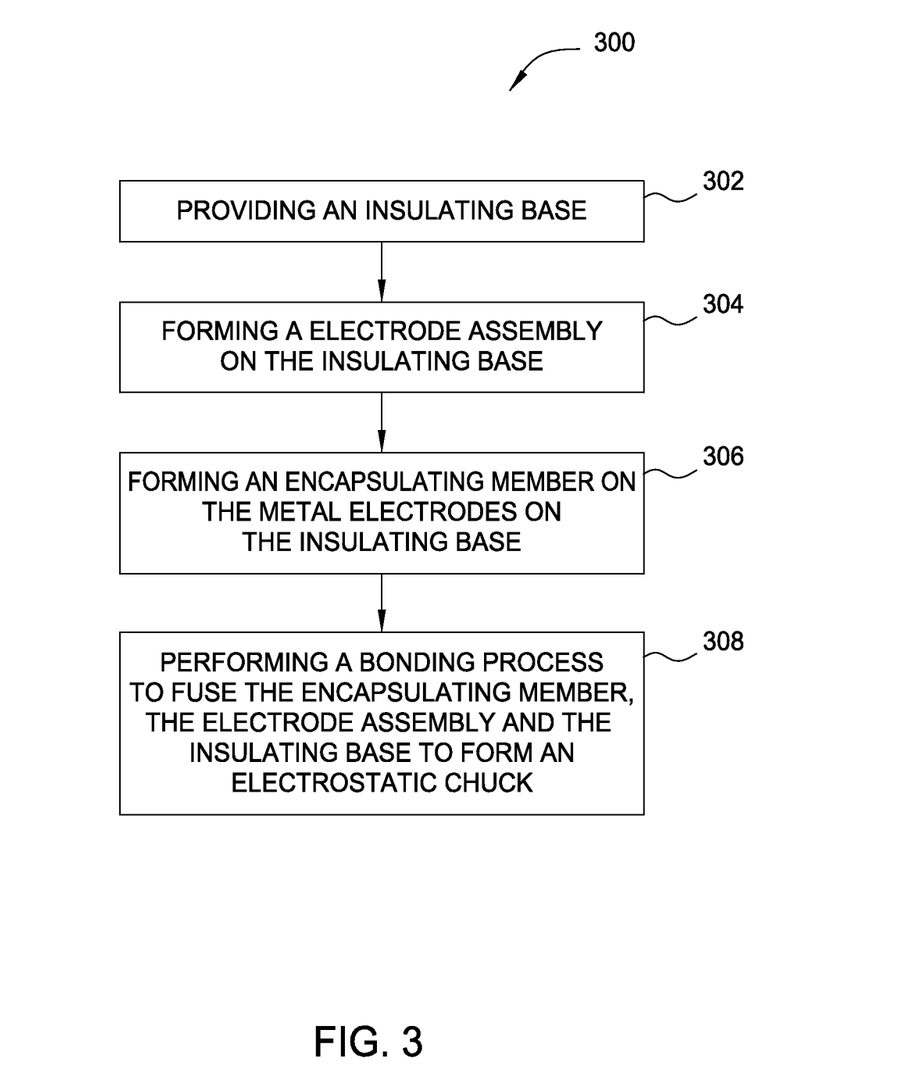
FIG. 3 depicts a flow diagram of a method for manufacturing an electrostatic chuck in accordance with one embodiment of the present invention.
Figure 4A:
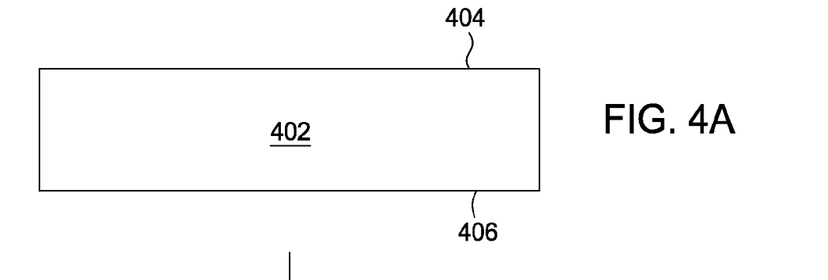
FIGS. 4A-4C depict a sequence for manufacturing an electrostatic chuck in accordance with one embodiment of the invention.
Figure 4B:
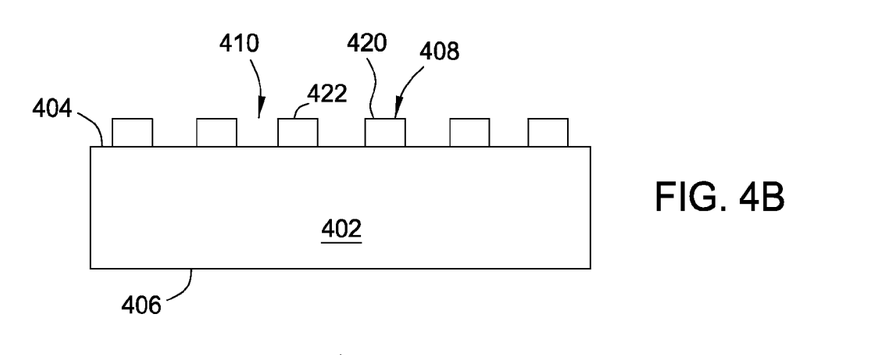
Figure 4C:
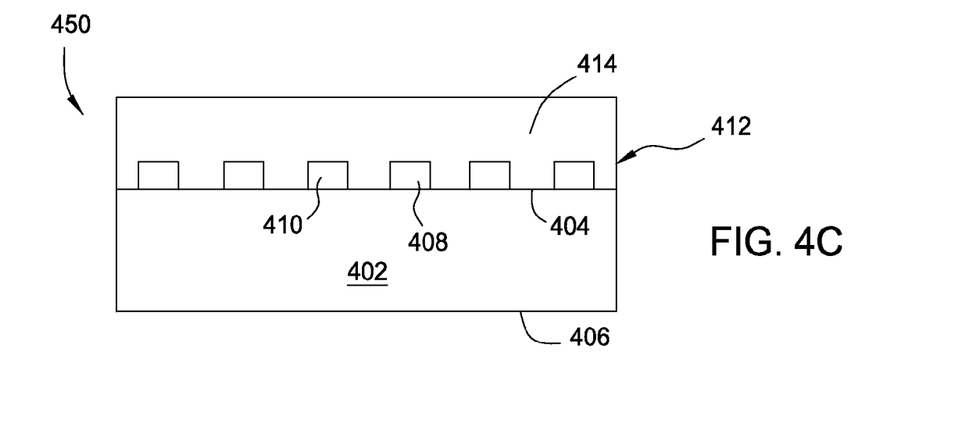

FIG. 3 depicts a flow diagram of a method for manufacturing an electrostatic chuck in accordance with one embodiment of the present invention. FIGS. 4A-4C depict a sequence for manufacturing the electrostatic chuck of FIG. 3 in accordance with one embodiment of the invention. The method 300 starts at the step 302 by providing an rigid support base 402, having a first surface 404 and a second surface 406, as shown in FIG. 4A. The first surface 404 of the rigid support base 402 is adapted to receive the other components of the electrostatic chuck. The second surface 406 of the rigid support base 402 is adapted to be disposed on a pedestal, such as the pedestal 202 depicted in FIG. 2, to form a substrate support assembly. As discussed above, the rigid support base 402 may be manufactured by an insulating material to support an electrode assembly subsequently formed thereon. In one embodiment, the rigid support base 402 is manufactured from glass, aluminum nitride or aluminum oxide. The rigid support base 402 may have a plan area selected to accommodate the size and shape of a substrate to be disposed thereon. In one example, the rigid support base 402 may be a circular shape having a diameter between about 4 inches and about 18 inches. Alternatively, the plan area may be polygonal, such as rectangular.

At step 304, an electrode assembly 412 is disposed on the first surface 404 of the rigid support base 402. Similar to the electrode assembly 106 described above with referenced to FIGS. 1-2, the electrode assembly 412 may include a first electrode 408 and a second electrode 410 for generating charges with different polarities when powered by a power source 414.

In one embodiment, the electrode assembly 412 may be formed by metallic bars, sheets, mesh, foils, and be pre-molded, pre-casted and pre-manufactured and placed onto the first surface 404 of the rigid support base 402 during fabrication of the electrostatic chuck. Alternatively, a metal deposition process may be performed to deposit and form the electrode assembly 412 directly on the first surface 404 of the rigid support base 402. Suitable deposition processes include PVD, CVD, plating, ink jet printing, rubber stamping, screen printing and aerosol print process. Additionally, metal paste/metal lines may be formed on the first surface 404 of the rigid support base 402. The metal paste/metal lines may initially be a liquid, paste or metal gel that may be patterned on to the substrate surface in a desired pattern, such as an array of adjacent rectangles, circles, hexagons, or other similarly shaped features to form desired electrode fingers with different configurations or dimensions on the first surface 404 of the rigid support base 402. As discussed above, the first and the second electrodes 408, 410 may each have a plurality of electrode fingers 420, 422.

At step 306, an encapsulating member 414 is disposed on the electrode assembly 412 present on the rigid support base 402, as shown in FIG. 4C. The encapsulating member 414 may be a ceramic material, or a glass material. The encapsulating member 414 may be formed on the electrode assembly 412 by a chemical vapor deposition (CVD) process, PECVD process, a spin coating process, a flame coating process, aerosol deposition process, physical vapor deposition (PVD) process, immersion coating, sputtering, thermal spraying coating (e.g., plasma spraying coating), non-plasma, non-thermal assisted coating, hot isostatic pressing, cold isostatic pressing, lamination, compression molding, casting, compacting, sintering or co-sintering techniques or any suitable process to form a ceramic material or a glass material on the electrode assembly 412. In one embodiment, the ceramic material selected to fabricate the encapsulating member 414 is at least one of glass, sapphire, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). The encapsulating member 414 may have a thickness between about 0.05 mm and about 2 mm.

In one embodiment, the encapsulating member 414 may have a coefficient of thermal expansion between about 2 μm/(m*K) and about 8 μm/(m*K). The encapsulating member 414 may have an enhanced heat resistance and a melting point greater than 1000 degrees Celsius. The electrostatic chuck working temperature is greater than about 600 degrees Celsius. The encapsulating member 414 may have a hardness (Vicker 1 Kgf) between about 10 GPa and about 30 GPa, a surface roughness between about 1 μ-inch and 6 μ-inch, such as about 4 μ-inch, and water absorbency of about less than 1 percent of less.

At step 308, a bonding process is performed to fuse both the encapsulating layer 414 and the rigid support base 402 together as a whole, forming an unitary structure, e.g., a single component, of the electrostatic chuck 450, as shown in FIG. 4C. In one embodiment, the bonding process may consolidate the encapsulating layer 414, the electrode assembly 412 and the rigid support base 402 to form into an integral part.

It is noted that different types of bonding processes may be utilized, such as, but not limited to annealing, sintering, adhering, slumping or diffusion bonding. In one example, the bonding process at step 308 is an annealing process. The annealing process may be performed by any suitable curing or annealing tool, such as oven, furnace, thermal plate, rapid thermal processing (RTP) chamber, spike anneal, or laser annealing chamber, and the like. The annealing process may be performed at a temperature between about 1200 degrees Celsius and about 2500 degree Celsius to assist the consolidation of the encapsulating layer 414, the electrode assembly 412 and the rigid support base 402 to form into an integral part.

Thus, an electrostatic chuck with enhanced heat resistance is provided in the present invention. The high temperature electrostatic chuck allows for greater process temperature windows and increased service life. Moreover, the ability to retain a workpiece after power has been removed from the electrodes allows chuck to be utilized in a great array of applications.

While the foregoing is directed to embodiments of the present invention, other and further embodiments of the invention may be devised without departing from the basic scope thereof, and the scope thereof is determined by the claims that follow.

What is claimed is:

1. An electrostatic chuck comprising:
   a support base;
   an electrode assembly having interleaved electrode fingers formed above and in direct contact with the support base, wherein each electrode finger includes interconnections formed between electrode islands, wherein the interconnections and the electrode islands in combination form the electrode fingers in a longitudinal form, each electrode finger is spaced apart, defining a space therebetween; and
   an encapsulating member disposed on and in direct contact with the electrode assembly, wherein the encapsulating member is fabricated from one of a ceramic material or glass.

2. The electrostatic chuck of claim 1, wherein the ceramic material used to fabricate the encapsulating member is selected from a group consisting of glass, sapphire, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN).

3. The electrostatic chuck of claim 1, wherein the encapsulating member has a coefficient of thermal expansion between about 2 μm/(m*K) and about 8 μm/(m*K).

4. The electrostatic chuck of claim 1, wherein the encapsulating member has a thickness between about 0.05 mm and about 2 mm.

5. The electrostatic chuck of claim 1, wherein the electrode assembly includes a first electrode and a second electrode.

6. The electrostatic chuck of claim 5, wherein the electrode fingers extend from each of the first and the second electrodes.

7. The electrostatic chuck of claim 5, wherein the electrode fingers are segmented.

8. The electrostatic chuck of claim 1, wherein the support base is rigid.

9. The electrostatic chuck of claim 1, wherein the support base is fabricated from a ceramic or a glass material.

10. The electrostatic chuck of claim 1, wherein electrostatic chuck working temperature greater than about 600 degrees Celsius.

11. A method for fabricating an electrostatic chuck, comprising:
    disposing an electrode assembly on and in direct contact with a support base, wherein the electrode assembly includes a plurality of intervening electrode fingers, wherein each electrode finger includes interconnections formed between electrode islands, wherein the interconnections and the electrode islands in combination form the electrode fingers in a longitudinal form, each electrode finger is spaced apart, defining a space therebetween; and
    forming an encapsulating member on and in direct contact with the electrode assembly, wherein the encapsulating member is fabricated from a glass or ceramic material.

12. The method of claim 11, wherein the encapsulating member is formed by a chemical vapor deposition (CVD)

process, PECVD process, a spin coating process, a flame coating process, aerosol deposition process, physical vapor deposition (PVD) process, immersion coating, sputtering, thermal spraying coating, non-plasma, non-thermal assisted coating, hot isostatic pressing, cold isostatic pressing, lamination, compression molding, casting, compacting, sintering or co-sintering techniques.

13. The method of claim 11 further comprising:
bonding the support base, the electrode assembly and the encapsulating member to form an integral part.

14. The method of claim 13, wherein bonding process heats the support base, the electrode assembly and the encapsulating member to a temperature between about 1200 degrees Celsius and about 2500 degrees Celsius.

15. The method of claim 11, wherein the electrode assembly is disposed on the support base by a ink jet printing process, rubber stamping process, screen printing process or aerosol print process.

16. The method of claim 11, wherein the electrode assembly comprises at least two independently bias able electrodes.

17. The method of claim 11, wherein the ceramic material used to fabricate the encapsulating member is selected from a group consisting of glass, sapphire, silicon carbide, aluminum nitride, aluminum oxide, yttrium containing materials, yttrium oxide ($Y_2O_3$), yttrium-aluminum-garnet (YAG), titanium oxide (TiO), and titanium nitride (TiN).

18. The method of claim 11, wherein the encapsulating member has a coefficient of thermal expansion between about 2 μm/(m*K) and about 8 μm/(m*K).

19. An electrostatic chuck, comprising:
a support base fabricated from glass or a ceramic material;
an electrode assembly disposed on and in direct contact with the support base, wherein the electrode assembly has at least two independently bias able electrodes having a plurality of interleaving electrode fingers formed therein, wherein each electrode finger includes interconnections formed between electrode islands, wherein the interconnections and the electrode islands in combination form the electrode fingers in a longitudinal form, each electrode finger is spaced apart, defining a space therebetween; and
an encapsulating member disposed on and in direct contact with the electrode assembly, the encapsulating member fabricated from a glass or ceramic material having a coefficient of thermal expansion substantially matching the coefficient of thermal expansion of a material forming the electrode assembly.

20. The electrostatic chuck of claim 19, wherein the ceramic material used to fabricate the encapsulating member is selected from a group consisting of glass, sapphire, silicon carbide, aluminum nitride, aluminum oxide, yttrium containing materials, yttrium oxide ($Y_2O_3$), yttrium-aluminum-garnet (YAG), titanium oxide (TiO), and titanium nitride (TiN).

* * * * *